United States Patent
Skog et al.

(10) Patent No.: US 7,386,079 B2
(45) Date of Patent: Jun. 10, 2008

(54) SEAMLESS CLOCK

(75) Inventors: Lars Skog, Molndal (SE); Niklas Legnedahl, Onsala (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 426 days.

(21) Appl. No.: 10/502,422

(22) PCT Filed: Feb. 14, 2002

(86) PCT No.: PCT/SE02/00252

§ 371 (c)(1),
(2), (4) Date: Jul. 23, 2004

(87) PCT Pub. No.: WO03/069451

PCT Pub. Date: Aug. 21, 2003

(65) Prior Publication Data

US 2005/0123085 A1 Jun. 9, 2005

(30) Foreign Application Priority Data

Feb. 14, 2002 (WO) ............. PCT/SE02/00252

(51) Int. Cl.
*H04L 7/00* (2006.01)
*H03D 3/24* (2006.01)
(52) U.S. Cl. .............. 375/354; 375/356; 375/358; 375/375
(58) Field of Classification Search ........... 375/354, 375/356, 358, 376, 375
See application file for complete search history.

(56) References Cited

U.S. PATENT DOCUMENTS

| | | | | | |
|---|---|---|---|---|---|
| 4,282,493 | A | * | 8/1981 | Moreau | 331/2 |
| 5,124,569 | A | * | 6/1992 | Phillips | 327/150 |
| 5,132,987 | A | * | 7/1992 | Motohashi et al. | 375/211 |
| 5,826,093 | A | * | 10/1998 | Assouad et al. | 712/43 |
| 5,870,441 | A | * | 2/1999 | Cotton et al. | 375/354 |
| 5,889,435 | A | * | 3/1999 | Smith et al. | 331/1 A |
| 5,974,560 | A |   | 10/1999 | Hotta et al. | |
| 6,078,192 | A | * | 6/2000 | Mitten et al. | 326/82 |

(Continued)

FOREIGN PATENT DOCUMENTS

EP 1139611 A2 10/2001

(Continued)

OTHER PUBLICATIONS

Swedish Patent Office, International Search Report for PCT/SE02/00252, dated Sep. 18, 2002.

*Primary Examiner*—Mohammed Ghayour
*Assistant Examiner*—Nurul M Matin
(74) *Attorney, Agent, or Firm*—Roger S. Burleigh

(57) ABSTRACT

System (10) comprising at least two units (1, 2) with clock functionality, the units being coupled to a common system clock line (SCLK), a common internal clock line (ICLK), and a logic bus (L-BUS), whereby one sole unit (1, 2) is being dedicated as a mater unit at a time. One source clock signal (CLK10, CLK20) of a unit is output on the internal clock line (ICLK) and all PLL devices of all units generates PLL output signals derived from the internal clock signal, the outputs of the PLL devices (CLKP1, CLKP2) being in phase with one another such that switchover from one PLL output signal to another is seamless.

7 Claims, 4 Drawing Sheets

U.S. PATENT DOCUMENTS

| | | |
|---|---|---|
| 6,194,969 B1 | 2/2001 | Doblar |
| 6,359,945 B1 * | 3/2002 | Doblar ........................ 375/357 |
| 6,516,422 B1 * | 2/2003 | Doblar et al. ................ 713/503 |
| 6,731,709 B2 * | 5/2004 | Doblar ........................ 375/357 |
| 6,754,745 B1 * | 6/2004 | Horvath et al. ................ 710/58 |
| 7,180,821 B2 * | 2/2007 | Ruckerbauer et al. ...... 365/233 |
| 2003/0042957 A1 * | 3/2003 | Tumura ........................ 327/233 |
| 2004/0098649 A1 * | 5/2004 | Watanabe .................... 714/741 |

FOREIGN PATENT DOCUMENTS

| | | |
|---|---|---|
| WO | WO0080460 A1 | 11/2000 |
| WO | WO0171920 A1 | 9/2001 |

* cited by examiner

SEAMLESS CLOCK

FIELD OF THE INVENTION

The present invention relates to systems relying on a plurality of clock sources.

BACKGROUND OF THE INVENTION

Larger computer and control systems are often distributed on a plurality of circuit boards, each having its own clock source. Typically, real time applications require accurate phase aligned reference clock signals in order to guarantee that the operation will be unaffected in case of a failure of a clock source or failure of a unit incorporating such a clock source. It is known to generate a common system clock from at least one of a plurality of clock sources, such that a system reference clock signal is provided, preferably with insignificant phase delays, to each of the plurality of boards. Should any circuit board or any clock source malfunction, the function of the system clock should be restored or retained. It should also be possible to replace a single circuit board without seriously interrupting the operation of the remaining system, i.e. hot swapping circuit boards.

Prior art document U.S. Pat. No. 6,194,969 shows a redundant clock system comprising a first clock board and a second clock board, a system board and a system controller. Each clock board comprises at least one clock source. In operation, one clock board is providing a master clock signal while the other is providing a slave aligned clock signal. If the master clock signal is found to loose as little as one clock edge, an input clock failure is identified by the system board and a switchover is made, for instance within three clock cycles, to the redundant slave clock signal in phase alignment with the master clock signal. Any of the first or second clock boards may be hot swapped with a third clock board.

In prior art document U.S. Pat. No. 6,194,969 two phase-locked signals are provided for redundancy. To make use of these redundant clock signals, every receiver needs two inputs and selection circuitry to switch between the redundant clock signals.

Prior art document U.S. Pat. No. 4,282,493 shows a redundant clock generating circuitry for providing an uninterrupted clock signal. Two clock modules are provided each comprising a first PLL oscillator and a second PLL oscillator monitoring the first PLL oscillator and providing an out-of-lock signal upon detection of any disparity there-between. One clock is master and the other is slave. Switching the master from one clock module to the other will not cause any phase discontinuities or momentary bit transitions on output clock signals because the master and slave clock are phase locked with regard to one another prior to and after switching. Switching from one clock to the other may be initiated upon detection of a malfunction as indicated by an out-of-lock signal.

If there is a failure on the master clock module in U.S. Pat. No. 4,282,493, the signal from the slave unit will seamlessly take over. However, when the slave module takes over as master, the signal from this board is physically driven through the board of the previous master. If the previous master board is removed, all boards of the system will loose their clock signal; i.e. hot-swapping of the clock modules is not possible.

Moreover, apart from the PLL devices used for phase locking of the two sources, U.S. Pat. No. 4,282,493 assumes a PLL in the receiver end and requires additional logic on all boards of the system sharing a common clock in the same manner as in U.S. Pat. No. 6,194,969.

SUMMARY OF THE INVENTION

It is a primary object of the invention to set forth a system, which provides a virtually seamless clock signal if a local clock or clock unit malfunctions or a clock unit is hot swapped and which does not require a superior system component to secure redundancy.

This object has been accomplished by the subject matter defined in the claims.

It is moreover an object to set forth an extendable clock system, which is based on a single modular unit.

This object has been accomplished in the claims.

It is a further object of the invention to set forth a unit which provides a virtually seamless clock signal if a local clock or clock unit malfunctions or a clock unit is hot swapped and which does not require a superior system component to secure redundancy.

This object has been accomplished by the subject matter set forth in the claims.

More advantages will appear from the following detailed description of preferred embodiments of the invention.

DETAILED DESCRIPTION OF PREFERRED EMBODIMENTS OF THE INVENTION

Figure 1:
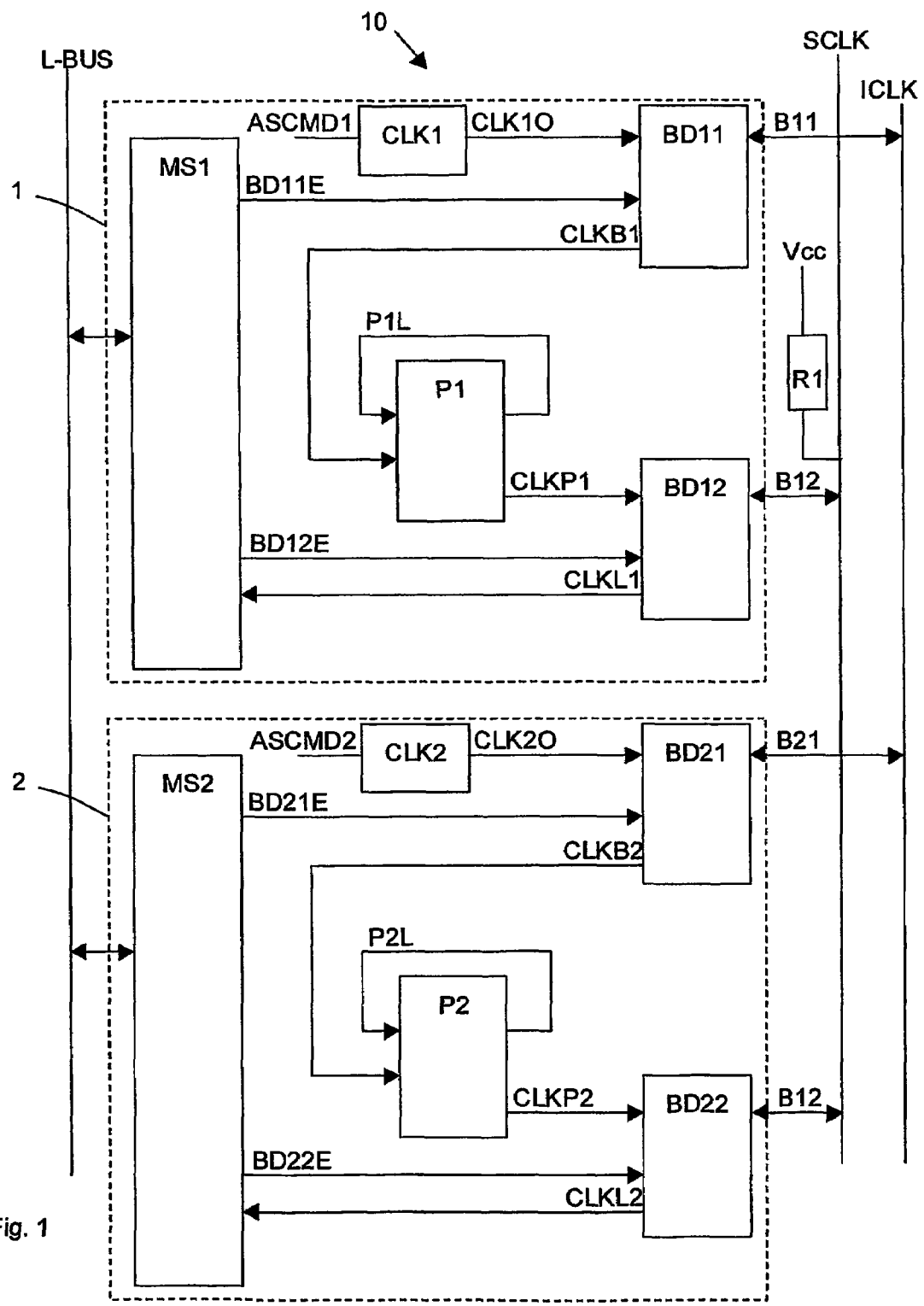
FIG. 1 shows a preferred embodiment of the invention of local clock circuitry of two exemplary units being interconnected by means of a clock bus and logic bus.

In FIG. 1, an apparatus 10 comprising two units 1 and 2 have been disclosed. Each unit comprises a clock functionality and additional functionality (not shown). The clock functionality of the two units are identical and are coupled to one another over a clock bus, comprising a system clock line, SCLK, and an internal clock line, ICLK, and over a logic bus, L-BUS. The additional functionality could relate to virtually any functionality requiring a clock signal, such as telecom radio base station functionality. The additional functionality of the units may not necessarily be the same. Advantageously, the units could be arranged on separate circuit boards fitting in a common rack. Moreover, three or more units could be coupled to the above-mentioned busses; whereby a given unit is master and the other units are slaves. The system clock SCLK is the clock reference signal provided to all units from the given dedicated master unit.

The first unit comprises a logic section MS1, a clock source CLK1, comprising for instance a quartz clock, a phase lock loop (PLL) device P1, a first bidirectional port BD11 and a second bi-directional port BD12.

The clock source CLK1 is generating a clock source signal CLK10, which may be halted upon reception of an asynchronous command signal ASCMD1. The clock source signal CLK10 is issued to the first bi-directional port BD11. Depending on the state of an enable signal BD11E, BD11 has the following function: If enabled, BD11 outputs the source clock signal CLK10 to the internal clock ICLK over a line B11 and concurrently imports the same clock signal. If disabled, BD11 imports a clock signal from the internal clock ICLK over a line B11

The first bi-directional port BD11 transfers the occurring source signal on line B11 into line CLKB1 to phased lock loop (PLL) device P1. As is commonly known, a PLL device will, if exposed to a periodical input signal, provide the same signal on its output. However, should a single pulse alter in the input signal or should the frequency of the input signal alter stepwise, the PLL will—in analogy to a gyro system—slowly change its output such that the output gradually will match the frequency and phase of the incoming signal. The PLL device contains an internal feedback loop illustrated by line P1L.

The PLL device P1 produces a derived clock signal CLKP1 that is input to second bi-directional port BD12. Depending on the state of an enable signal BD12E, BD12 has the following function: If enabled, BD12 outputs the source clock signal CLKP1 to the system clock SCLK over a line B12 and concurrently imports the same clock signal. If disabled, BD12 imports a clock signal from the system clock SCLK over a line B12 and passes it further on as a signal CLKL1.

The derived clock signal present on system clock SCLK is lead to logic section MS1.

Both enable signals BD11E and BD12E is output from logic signal MS1.

The second unit 2 is identical to unit 1, although the reference numerals of unit 2 are different for the same type of elements found in unit 1.

As mentioned above, operation is so that one unit is master while the remaining units are slaves. In a preferred embodiment, the master unit controls the system clock SCLK and the internal clock ICLK, while the slave units sense the former two clock signals.

The change of master from one unit to another is accomplished according to the operation of logic sections MS1 and MS2. The operation enables switching according to sensed error states but also enables intended master changeovers, which are not caused by faults. The dedication of master unit is dependent on a signal being given on the L-bus so as not to select a given unit for being a master unit, and if a given unit is dedicated as master unit when such a signal on the L-bus is given, the system performs a switchover causing another unit as the one not selected to be dedicated as master unit.

The changeover could be effectuated by an external asynchronous signal, such as the one given when an operator prepares for a hot swap and for instance gives a command signal ASCMP1.

The logic section of a given unit is synchronised with the system clock SCLK over the signal lines CLKL1, CLKL2.

Figure 2:
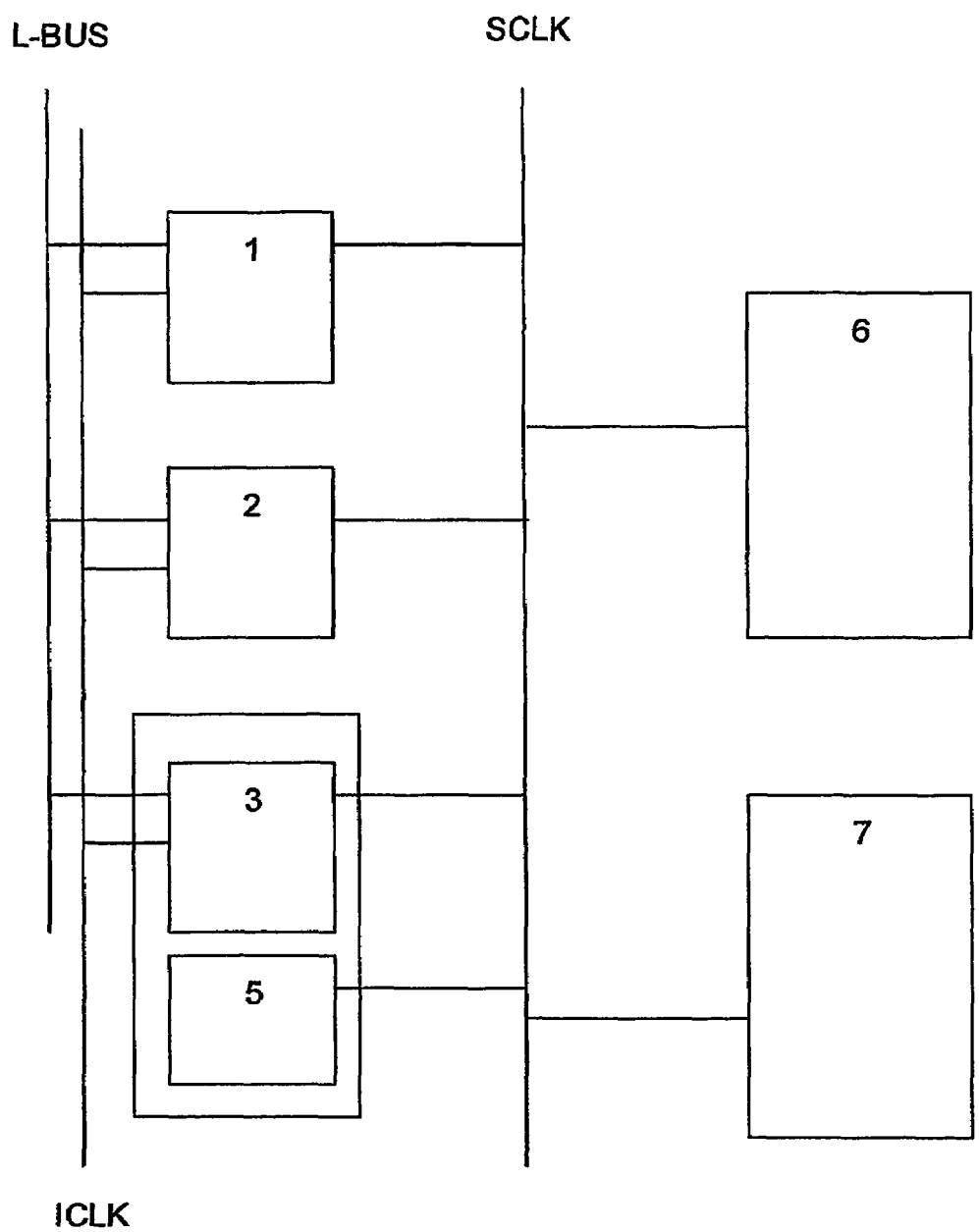
FIG. 2 shows an exemplary embodiment comprising three redundant clock boards and two boards with additional functionality but without any clock circuitry.

In FIG. 2, another exemplary coupling scheme according to the invention has been shown comprising three redundant clock units 1, 2 and 3 on separate boards and two boards 6, 7 with additional functionality but without any clock generating or clock evaluating functionality. All boards are connected over the system clock line SCLK. The clock unit 3 and additional functionality 5 reside on the same board.

The clock units are moreover interconnected by the L-BUS and the internal clock line ICLK.

Figure 3:
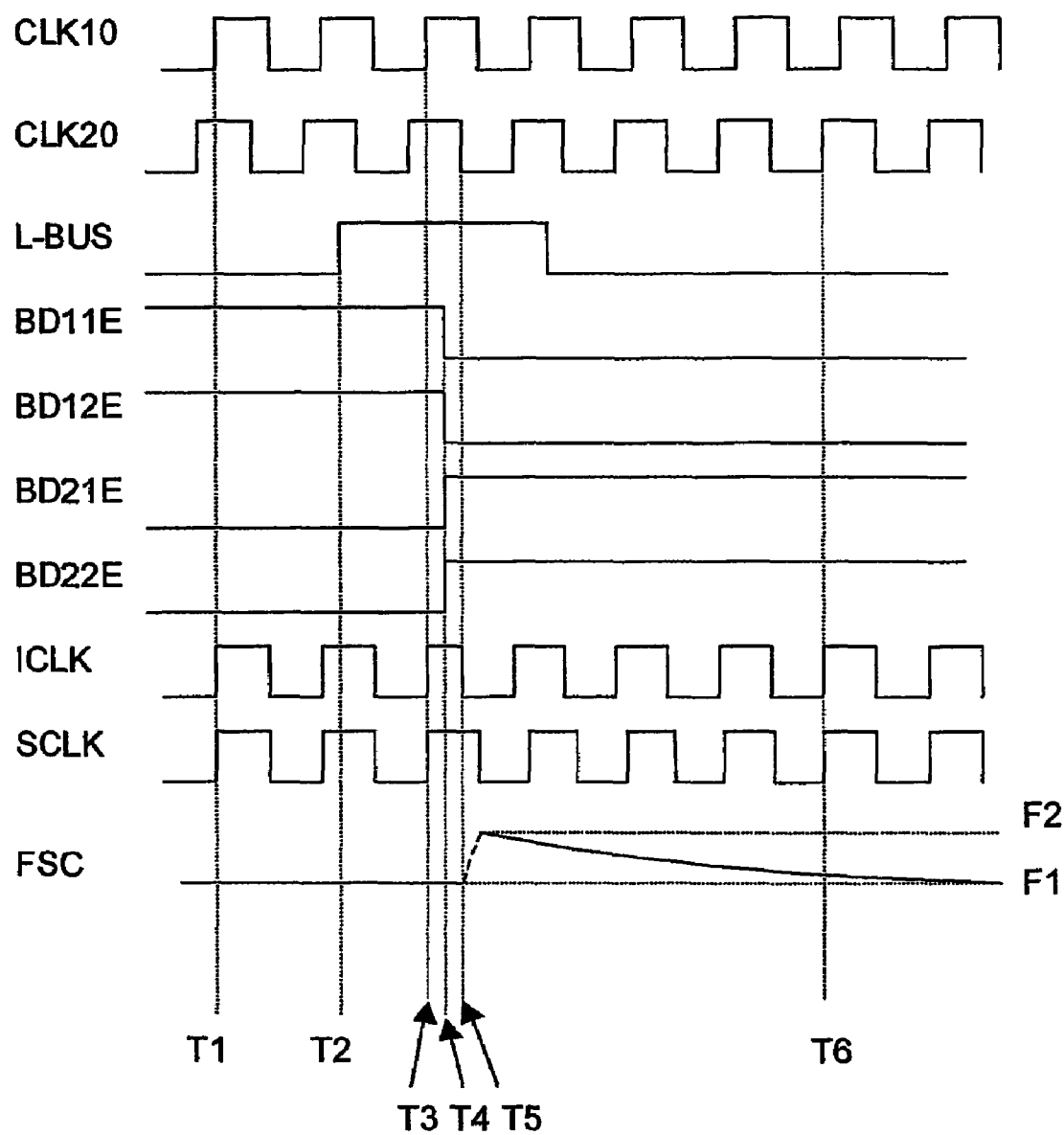
FIG. 3 shows an exemplary timing diagram relating to the operation of the units shown in FIG. 1, in which initially unit 1 is master and unit 2 is slave and where subsequently unit 2 is master and unit 1 is slave.

The operation shall now be explained with regard to the following exemplary timing diagram shown in FIG. 3, in which an external asynchronous input effects a switchover.

At a given point in time T1, the two clock sources CLK1 and CLK2 produce two signals CLK10 and CLK20 of substantially the same frequency but which are lagging in phase to one another with an arbitrary phase difference that could amount to +/−180 degrees.

As appears from FIG. 3, at time T1 the internal clock ICLK is in phase with the system clock SCLK.

At time T2, a signal indicative of an intended change in master from unit 1 to unit 2 is signalled on the L-BUS. Following the subsequent positive flank T3 of the system clock SCLK, all enable signals BD11 E, BD12E, BD21E and BD22E changes states at T4. This effects the change of master from unit 1 to unit 2.

The internal clock signal ICLK is given by the source clock chosen, corresponding to the selected master. Before T5, the internal clock is following CLK10 and after T5, the internal clock follows CLK20, as signalled over BD11E and BD21E.

As is seen from FIG. 3, a phase shift in ICLK occurs at T5 as switchover is made between CLK10 and CLK20.

The signalling from the logic sections MS1 and MS2 secures that at all times the signals CLKB1, CLKB2 are fetched from the same clock source. Hence, the internal clock ICLK always depends on the one selected internal clock. Consequently, the inputs to the various PLL's are identical. All PLL's have the same predetermined characteristic and the tolerance level applicable for the PLL units are chosen to be appropriately small. Hence, the various outputs of the PLL's—CLKP1 and CLKP2—will always be substantially in phase and be dependent on the prevalent dedicated internal clock signal ICLK. Therefore, the system clock SCLK can be switched over virtually seamlessly from CLKP1 to CLKP2 and vice versa as controlled by logic signals BD12E and BD22E. The PLL's P1 and P2 will maintain generating phase aligned clock signals CLKP1 and CLKP2 for several clock cycles, even if no internal clock ICLK signal is present.

When the ICLK signal changes abruptly from a first phase value to a second phase value—as illustrated at T5—the PLL's will gradually change the phase of their outputs so that after a given period—at T6—the PLL's will be in phase with the second phase value of the ICLK signal. The inertia of the PLL's and the corresponding period of "ramp alignment" is chosen to match the system clock requirements of the additional functionality mentioned above. The phase change is off course associated with a change in clock cycle frequency. In FIG. 3, the frequency FSC of the system clock signal SCLK has been illustrated as changing from a first frequency F1 at time T1 to a second frequency F2 immediately after T5. Subsequently, the frequency FSC approaches asymptotically the first frequency F1. Advantageously, the alignment period T5-T6 is chosen to several clock cycles, such that the additional functionality "won't notice" the phase change. At time T6, the phase difference is illustrated as being insignificant.

As explained above, the enable signals BD11E, BD12E, BD21E and BD22E are related to the first positive edge of SCLK that is overlapped by the L-bus signal. Thereby the state changes of enable signals occur following a positive edge of SCLK. The short delay from SCLK going high at T3 to the enable signals are changing state at T4 is due to propagation delays in the circuitry.

Consequently, the switching of output enable signals is first accomplished when it is known that SCLK is in a logic high state at a time with a certain predetermined security time interval from state changes, i.e. at a certain distance to the flanks. It is important that the switch does not occur when there is a transition of SCLK, since this could cause disturbances at the receiver end.

An external circuitry is used to bias the SCLK line to a logic high state, in case no unit should drive the SCLK line. Since switching can only occur when SCLK is high, there is thus no possibility that no unit is driving the SCLK line for a short moment when one unit is turning off and the other is turning on. Advantageously, the external circuitry comprises a pull-up resistor R1 being arranged between a system high voltage Vcc and the system SCLK.

The means for providing error detection and the methods for obtaining appropriate fault management routines can be implemented in a variety of ways.

The logic sections MS of each unit comprises functionality to notify other units about whether the given unit is connected (or possibly suffers a fail state) to the I-CLK and the S-CLK line or not. Each logic unit moreover comprises functionality to learn about which other units are connected. Advantageously, a priority scheme is negotiated every time there is a change in the units being connected, involving that a priority scheme according to which a predetermined order for dedicating units is determined. Thereby, all units agree on a subsequent master is being dedicated in case another master suffers a fail state. The priority scheme could for instance be arranged according to the order at which modules are connected. A random order could also be envisioned. The logic sections constitute an autonomous control of the clock system disregarding the actual number of clock units being present. No superior or additional clock circuitry is needed.

Figure 4:
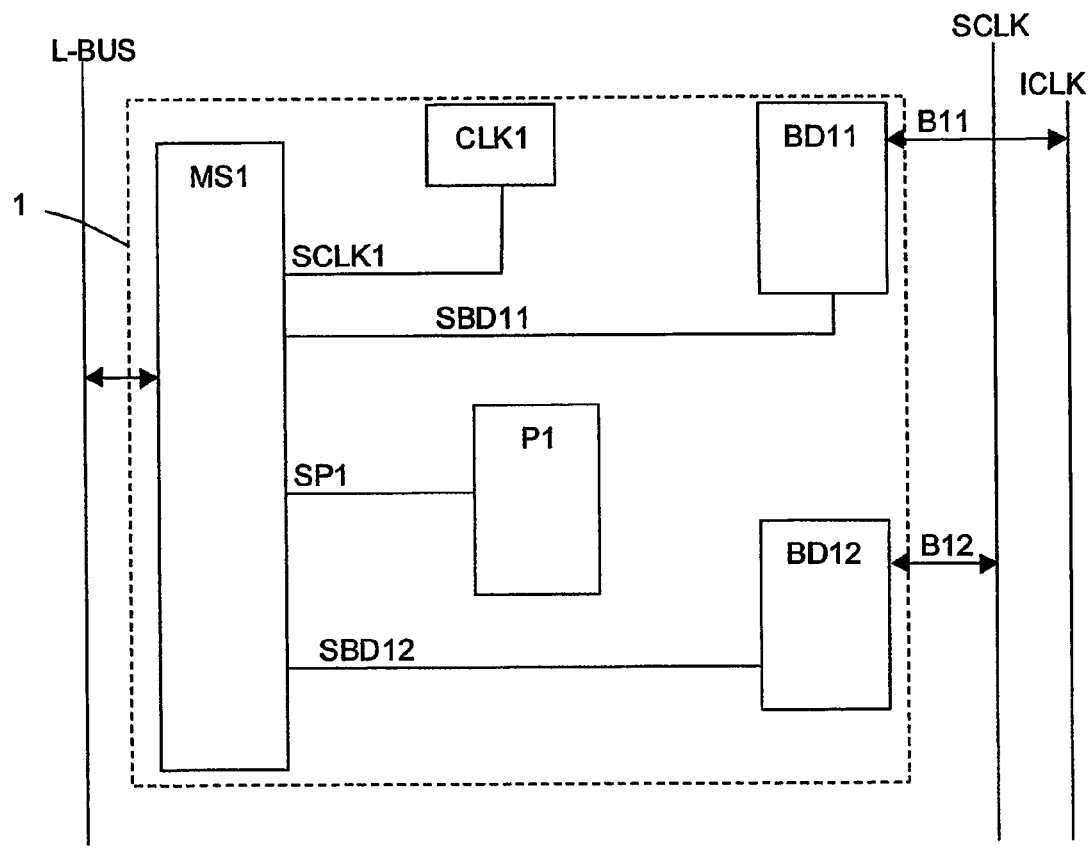
FIG. 4 shows a preferred embodiment of fault sense circuitry in the first unit shown in FIG. 1.

FIG. 4 shows a preferred embodiment of fault sense circuitry in the first unit shown in FIG. 1. For clarity, some of the lines and signals shown in FIG. 1 have been omitted from being represented on the FIG. 4, although they do exist in this embodiment. The operation of clock source CLK1 is provided with error status line SCLK1 that can be checked by the logic section MS1 reading the state of SCLK1. Likewise, the error status of bi-directional port BD11 is read over SBD11, the error status of bi-directional port BD12 is read over SBD12 and the error status of PLL device P1 is read over SP1.

When there is a transition on one of these inputs, it will be interpreted as an asynchronous switch command and will be treated in the same manner as a switch ordered by an operator. Another possibility is that a CPU (not shown) associated with the additional functionality of the board has a watchdog circuit. If the watchdog timer expires, a switchover command is generated.

It appears that if CLK1 or BD11 fails, switchover will not effect the system clock at all, disregarding whether unit 1 is master or slave.

If the PLL device P1 fails or the bidirectional port BD12 fails when unit 1 is master, a glitch will appear in the SCLK signal. Hence, in a preferred embodiment of the invention, the reliability of PLL devices and the bi-directional unit coupled to the output of the PLL device is of a high standard.

It should be noted that, the above mentioned type of faults would normally occur seldom in relation to other faults typically occurring in a system making use of the clock units. In typical applications, the additional functionality could be based on very large numbers of components. Hence, in those cases, on average an error is not likely to occur in the PLL devices or the bidirectional ports connected to the outputs of the PLL devices, but in some other component. This type of fault will be remedied by a hot swap of the module with the faulty component. The present invention provides for a seamless switch of units in those cases.

It should moreover be noted that alternative embodiments could be envisioned in which the master unit is not necessarily outputting the clock source on the internal clock line while controlling the system clock line at the same time. In principle, a given unit could be master for the system clock, while another unit could be master for the internal clock line. The logic circuitry could effectuate that in case more than two units are prevalent, a mastership for the system clock line is dedicated to a first unit while the mastership for the internal clock line is dedicated to another units.

The invention claimed is:

1. A computer system clocking system, said system comprising:
at least two units with clock functionality, the units being coupled to a common system clock line, a common internal clock line, and a logic bus, wherein one unit is dedicated as a master unit at a time, the dedication of the master unit being dependent on at least a signal being given so as not to select a given unit for being a master unit, and if a given unit is dedicated as master unit when such a signal is given, the system performing a switchover causing another unit as the one not selected to be dedicated as master unit, each unit comprising:
a clock source for generating a clock source signal, the clock source signal being adapted for being output on the internal clock line; and
a phase lock loop device generating a signal, which is derived from the signal on the internal clock line, and which is output on the system clock line if the unit is dedicated as master unit, wherein one source clock signal of a unit is output on the internal clock line and all phase lock loop devices of all units generate phase lock loop output signals derived from the internal clock signal, the outputs of the phase lock loop devices being in phase with one another such that switchover from one phase lock loop output signal to another is seamless.

2. The system according to claim 1. wherein the unit dedicated as master unit generates the clock source signal on the internal clock line.

3. The system according to claim 1, wherein each unit further comprises:
a logic section communicating with the logic bus;
a first bi-directional port communicating with the internal clock line;
a second bi-directional port communicating with a system clock line, the logic section of the unit controlling the first and second bi-directional ports to input or output respective system clock signals and respective internal clock signals via enable signals.

4. The system according to claim 3, wherein the enable signals first change state when the system clock is in a logic state with a certain predetermined security time interval from state changes of the system clock.

5. The system according to claim 3, wherein the logic section. in cooperation with other logic sections of other units, negotiates a priority scheme according to which a predetermined order for dedicating units is determined.

6. The system according to claim 1, wherein the logic section of any unit comprises fault sense circuitry and wherein, if a fault is detected in any device, the system initiates switchover from a dedicated unit to a subsequent dedicated unit.

7. The system according to claim 1, comprising an additional board not comprising any clock generating or clock evaluating functionality, the additional board being coupled to the system clock line but not to the internal clock line nor to the logic bus.

* * * * *